(12) United States Patent
Wang (10) Patent No.: US 10,861,794 B2
(45) Date of Patent: Dec. 8, 2020

(54) LOW FREQUENCY ELECTROMAGNETIC INTERFERENCE SHIELDING

(71) Applicant: Advanced Semiconductor Engineering, Inc., Kaohsiung (TW)

(72) Inventor: Pin Chuan Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/177,116

(22) Filed: Oct. 31, 2018

(65) Prior Publication Data

US 2020/0135657 A1    Apr. 30, 2020

(51) Int. Cl.
*H01L 23/552* (2006.01)
*H01L 23/00* (2006.01)

(52) U.S. Cl.
CPC ............ *H01L 23/552* (2013.01); *H01L 24/32* (2013.01); *H01L 2924/35121* (2013.01)

(58) Field of Classification Search
None
See application file for complete search history.

(56) References Cited

U.S. PATENT DOCUMENTS

| 2002/0148979 | A1 | 10/2002 | Featherby et al. |
| 2017/0347462 | A1* | 11/2017 | Miwa ...................... H01L 24/97 |
| 2019/0387648 | A1* | 12/2019 | Nagamune ............ C01B 32/168 |

* cited by examiner

*Primary Examiner* — Long Pham
(74) *Attorney, Agent, or Firm* — Foley & Lardner LLP (57) ABSTRACT

A semiconductor package device includes a substrate, an insulation layer disposed on the substrate, and a shielding layer. The shielding layer includes an adhesive layer and a base layer. The adhesive layer is disposed between the base layer and the insulation layer. The adhesive layer and the base layer include a filler including at least a resin. The shielding layer passes a peeling test class of at least 3B of a cross-cut method and the shielding effectiveness of the shielding layer is at least or equal to 30 dB.

19 Claims, 6 Drawing Sheets

Adhesion Cross-Cut Method/ 3M #600 tape test (According to ASTM standard)

| Example | | | | | | |
|---|---|---|---|---|---|---|
| ASTM class | 5B | 4B | 3B | 2B | 1B | 0B |
| Definition | Smooth cut without peeling | Peeling or damaged area less than 5% | Peeling or damaged area greater than 5% but less than 15% | Peeling or damaged area greater than 15% but less than 35% | Peeling or damaged area greater than 35% but less than 65% | Peeling or damaged area greater than 65% |

FIG. 5

LOW FREQUENCY ELECTROMAGNETIC INTERFERENCE SHIELDING

BACKGROUND

1. Technical Field

The present disclosure relates to shielding a semiconductor package from electromagnetic interference. Particularly, the present disclosure relates to a semiconductor package including a shielding layer for blocking low frequency electromagnetic interference.

2. Description of the Related Art

A comparative semiconductor package usually includes a shielding layer to shield an integrated circuit within the semiconductor package from electromagnetic interference. The thickness of the shielding layer is dependent on whether the shielding layer is intended to block electromagnetic interference signals with high frequency or low frequency. The high frequency refers to 0.5 GHz to 6 GHz, and the low frequency refers to 10 MHz to 100 MHz. For example, in order to achieve effects of shielding, the thickness of the shielding layer for blocking electromagnetic interference with relatively low frequency is thicker than the thickness of the shielding layer for blocking electromagnetic interference with relatively high frequency due to tunneling effects of low frequency signals.

For blocking electromagnetic interference with high frequency, a shielding layer is usually formed on a molding compound by a sputtering process. However, for blocking electromagnetic interference with low frequency, a relatively thicker shielding layer is specified, which may increase the manufacturing cost (due to e.g. an increased manufacturing time).

A comparative method of forming a shielding layer for blocking electromagnetic interference with low frequency on a molding compound is spray coating, which takes relatively shorter time than the sputtering process.

Moreover, for blocking electromagnetic interference with low frequency of 10 MHz, when the thickness of a shielding layer may reach about 40 μm, materials that meet the shielding specifications (Shielding Effectiveness≥30 dB) usually do not have good bonding strength, which means that the shielding layer may fail to pass the peeling test class of 3B of the cross-cut method (American Society for Testing and Materials standard). The reason is that a material suitable for the shielding layer usually has a low volume resistivity (Ω·cm). For example, a material for sputtering coating is pure metal, which has low volume resistivity. However, since this material has little resin or no resin at all, the adhesion between the shielding layer and a molding compound is decreased. This material will produce a certain degree of shrinkage during a continuous process of baking and sintering, and result in a reduction in the adhesion of the material with the low volume resistivity and the surface of the object, such as the molding compound, to be spray coated. Thus, even after the semiconductor package formed in the above-mentioned manner passes the reliability test, for example, Temperature Cycling Test, the shielding layer of the semiconductor package may still fail to pass at least the peeling test class of 3B of the cross-cut method.

SUMMARY

The present disclosure provides a shielding layer, which is a two-layer structure. The shielding layer comprises an adhesive layer and a base layer. The adhesive layer is disposed between the base layer and a molding compound. The adhesive layer has a conductive material with less shrinkage and serves as a buffer layer. The adhesive layer provides better adhesion between the base layer and the molding compound, so as to improve the bonding strength between the shielding layer and the molding compound caused by subsequent heating or the difference of the shrinkage.

Moreover, according to some embodiments of the present disclosure, compared with the sputtering process for forming a shielding layer for shielding electromagnetic interference, the present disclosure uses spray coating to form a thicker shielding layer for shielding electromagnetic interference with low frequency, which specifies a thicker shielding layer. The bonding strength between the shielding layer and the molding compound by the spray coating is significantly better than by the sputtering process.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
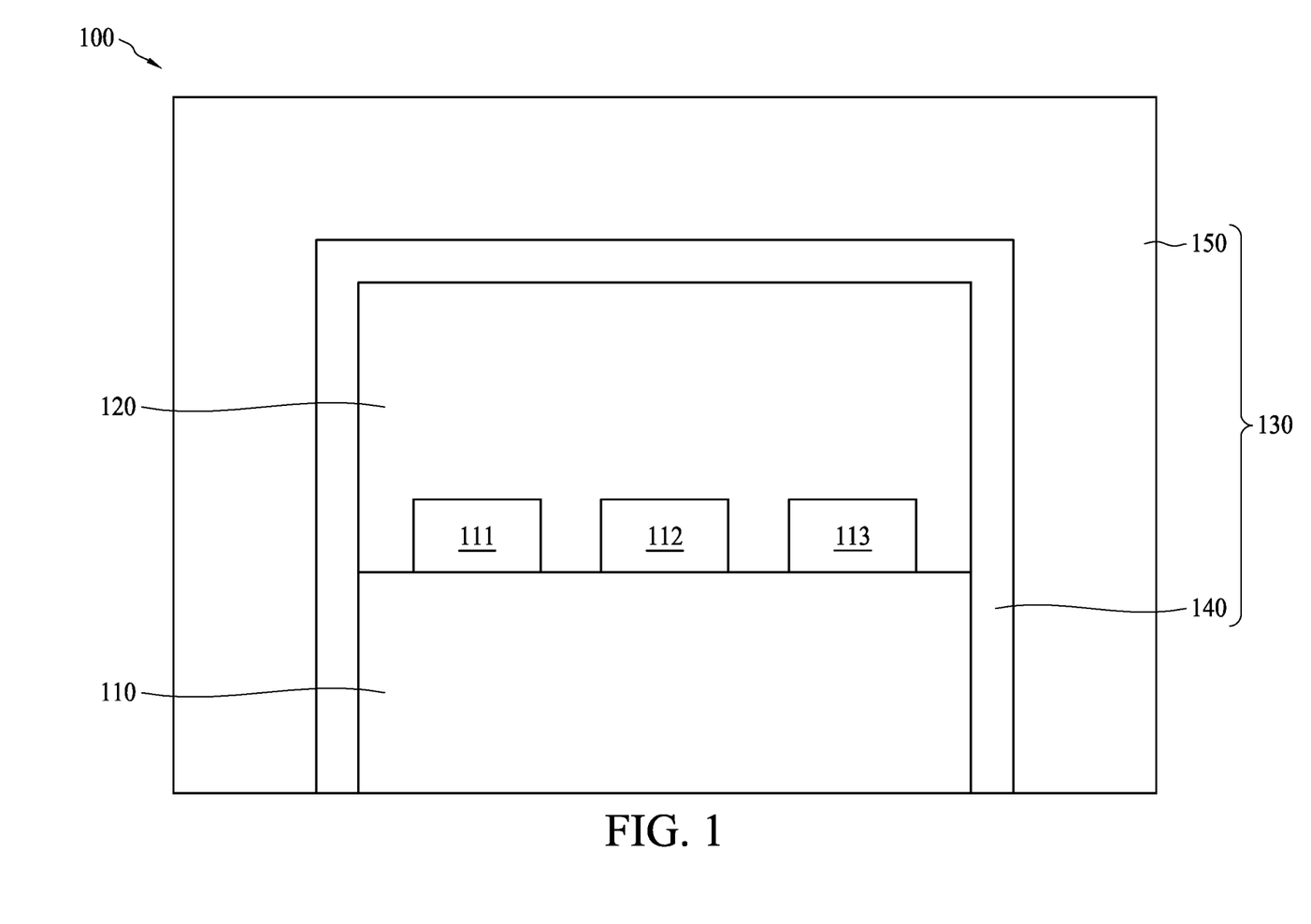
FIG. 1 shows a cross-sectional view of a semiconductor package device in accordance with some embodiments of the present disclosure.

FIG. 1 shows a cross-sectional view of a semiconductor package device 100 in accordance with some embodiments of the present disclosure. The semiconductor package device 100 comprises a substrate 110. An insulation layer 120 is disposed on the substrate 110. The insulation layer 120 may include a molding compound or encapsulation material.

A shielding layer 130 is disposed on the insulation layer 120. The shielding layer 130 shields or protects component(s) or device(s) (e.g., 111, 112, 113, and so forth) disposed on the substrate 110 from electromagnetic interference with relatively low frequency. The shielding layer 130 may include an adhesive layer 140 and a base layer 150. The adhesive layer 140 is disposed between the insulation layer 120 and the base layer 150.

The adhesive layer 140 includes filler(s) or particle(s) (not shown in FIG. 1). The adhesive layer 140 may include insulation filler(s). The adhesive layer 140 may include filler(s) which includes resin.

The base layer 150 includes filler(s) or particle(s) (not shown in FIG. 1). The base layer 150 may include insulation filler(s). The base layer 150 may include filler(s) which includes resin.

According to some embodiments of the present disclosure, the filler(s) comprises at least a metal particle. Thus, the adhesive layer 140 and the base layer 150 are conductive layers.

According to some embodiments of the present disclosure, the shielding layer 130 passes a peeling test class of at least 3B of a cross-cut method, and a shielding effectiveness of the shielding layer 130 is at least or equal to 30 dB.

According to some embodiments of the present disclosure, amount or quantity of the resin within the adhesive layer 140 is greater than that of the base layer 150. According to some embodiments of the present disclosure, amount or quantity of resin within the adhesive layer 140 is about 3~7% by weight. Amount or quantity of the resin within the base layer 150 is about 0.1~0.3% by weight. According to some embodiments of the present disclosure, amount or quantity of resin within the adhesive layer 140 is about 3~7% by volume. Amount or quantity of the resin within the base layer 150 is about 0.1~0.3% by volume.

Figure 2:
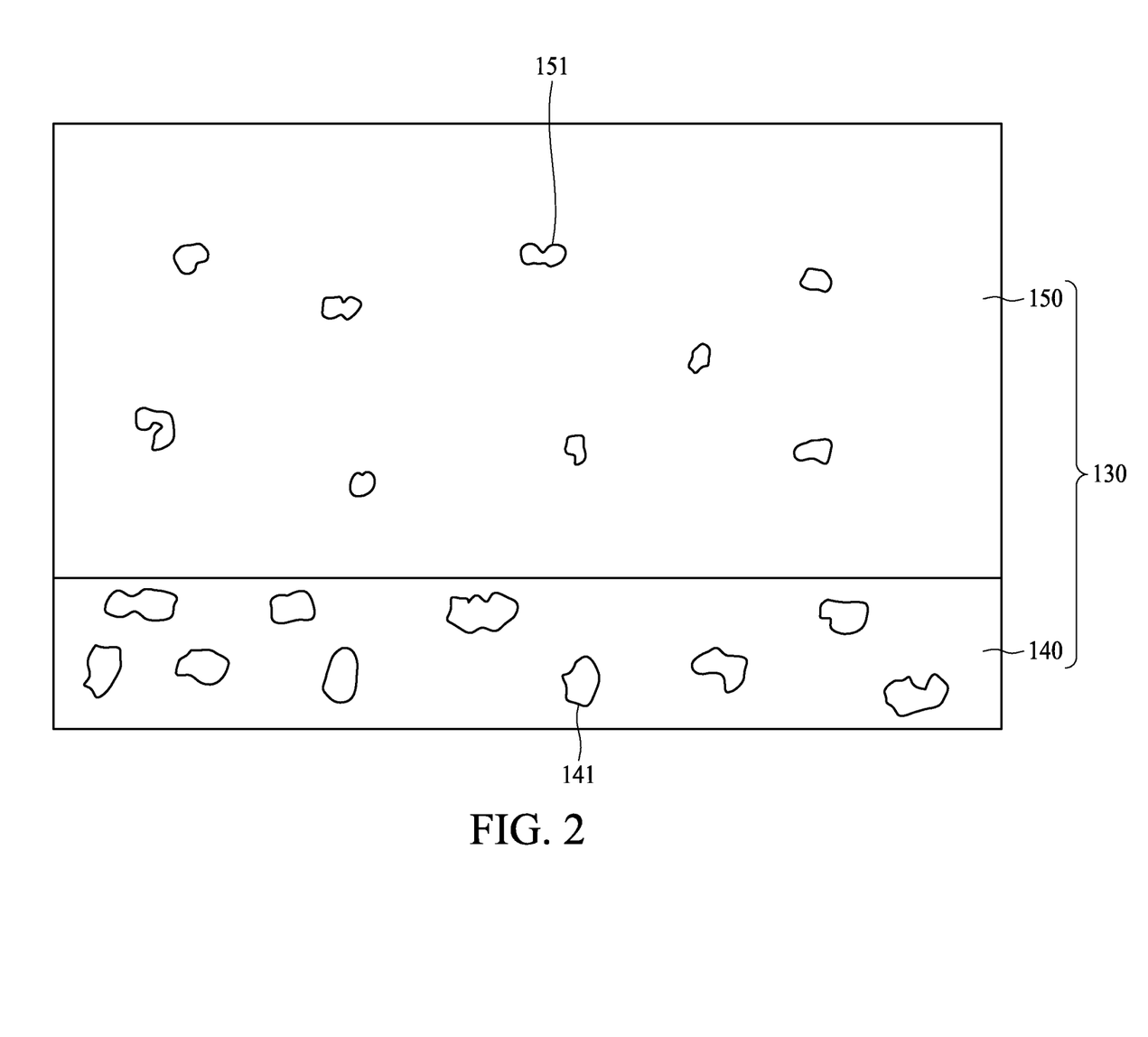
FIG. 2 illustrates a schematic diagram of a structure of a shielding layer of the semiconductor package device in accordance with some embodiments of the present disclosure.

FIG. 2 illustrates a schematic diagram of a structure of a shielding layer of the semiconductor package device in accordance with some embodiments of the present disclosure. Referring to FIG. 2, the shielding layer 130 of the semiconductor package 100 includes the adhesive layer 140 and the base layer 150. The adhesive layer 140 comprises filler(s) 141, and the base layer 150 comprises filler(s) 151.

As shown in FIG. 2, the fillers 141 and 151 are formed in irregular shapes in the shielding layer 130. According to some embodiments of the present disclosure, a size of the filler(s) 141 within the adhesive layer 140 is greater than a size of the filler(s) 151 within the base layer 150.

Figure 3A:
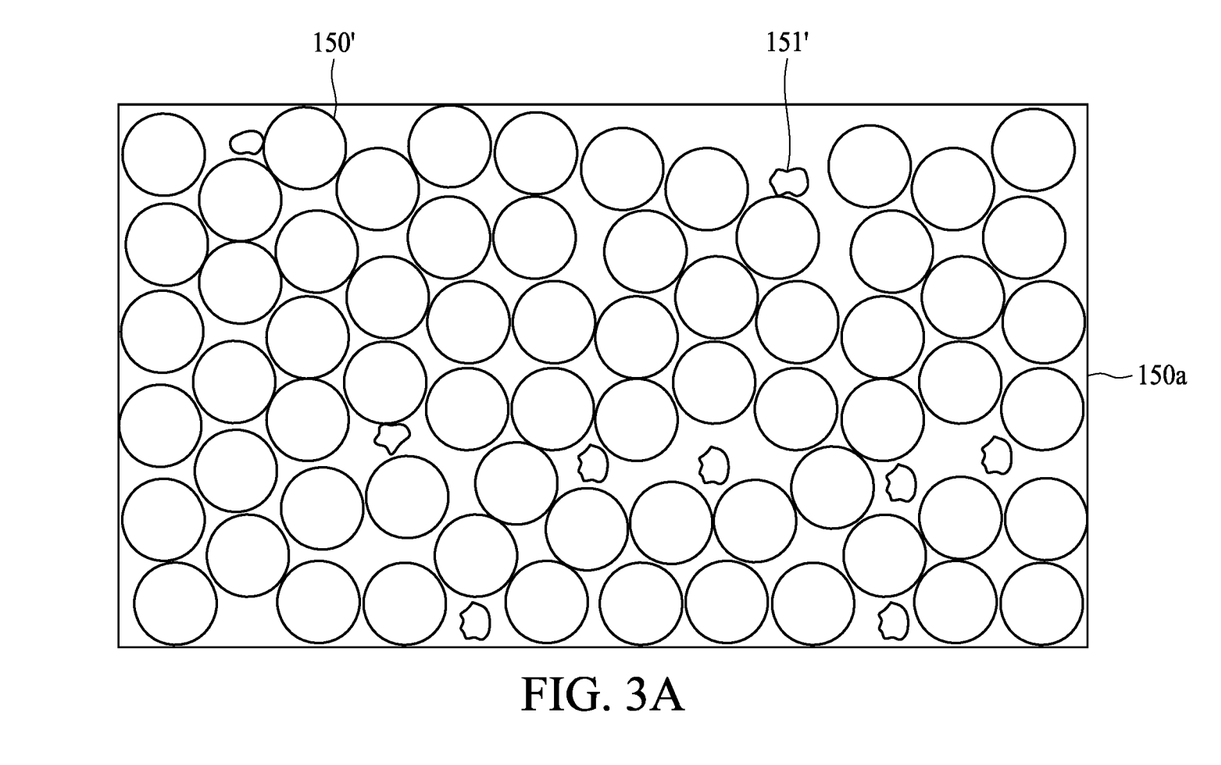
FIG. 3A illustrates a schematic diagram of a structure provided to form a base layer of the semiconductor package device in accordance with some embodiments of the present disclosure.

FIG. 3A illustrates a schematic diagram of a structure 150a provided to form the base layer 150 of the semiconductor package device 100. Referring to FIG. 3A, the structure 150a comprises metal particles 150' and filler(s) 151'.

Sintering techniques may be applied on the structure 150a to form the base layer 150. Curing techniques may be applied on the structure 150a to form the base layer 150 as illustrated and described with reference to FIG. 1.

Figure 3B:
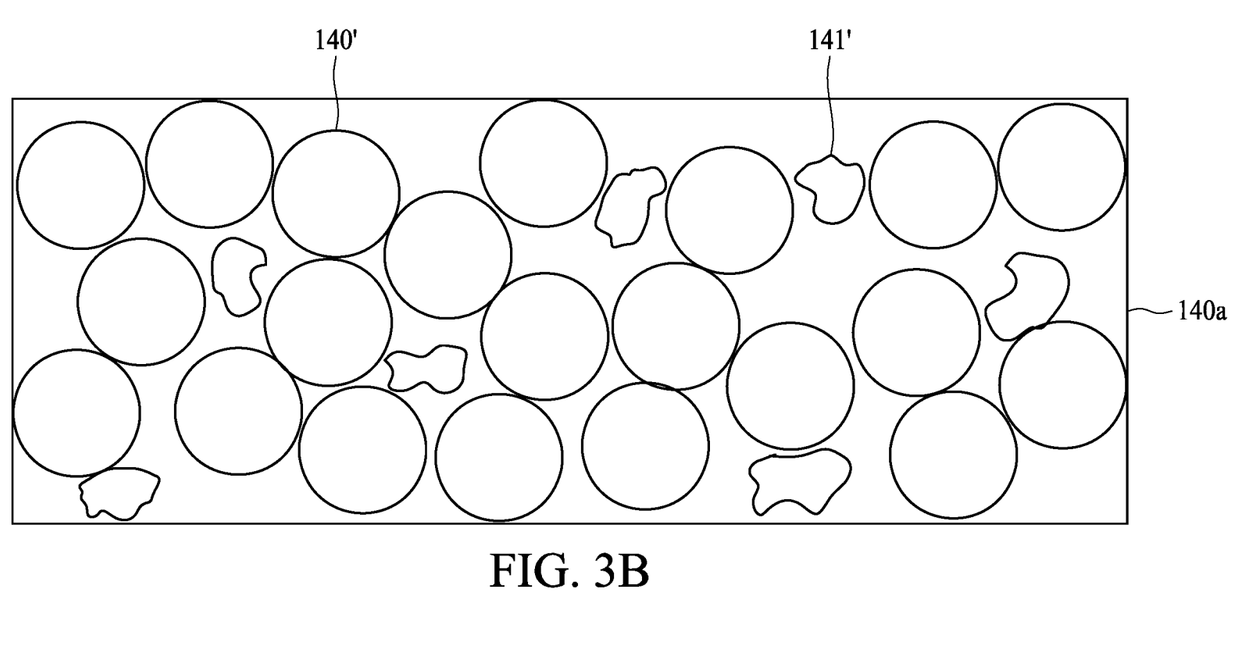
FIG. 3B illustrates a schematic diagram of a structure provided to form an adhesive layer of the semiconductor package device in accordance with some embodiments of the present disclosure.

FIG. 3B illustrates a schematic diagram of a structure 140a provided to form the adhesive layer 140 of the semiconductor package device 100. Referring to FIG. 3B, the structure 140a comprises metal particles 140' and filler(s) 141'.

Sintering techniques may be applied on the structure 140a to form the adhesive layer 140. Curing techniques may be applied on the structure 140a to form the adhesive layer 140 as illustrated and described with reference to FIG. 1.

According to some embodiments of the present disclosure, a size of the metal particles 140' in the structure 140a of the adhesive layer 140 is greater than a size of the metal particles 150' within the structure 150a of the base layer 150. The size of the filler(s) is <6 μm or less than the thickness of the adhesive layer 140.

The space between the metal particles is dependent on the size of the metal particles. If the metal particles, such as Ag, are smaller, the space becomes smaller. During a baking process, it is easier to sinter the metal particles to form a whole piece, so as to increase the conductivity of the base layer 150 and increase the shielding effectiveness.

According to some embodiments of the present disclosure, a volume resistivity of the adhesive layer 140 is greater than that of the base layer 150. Table 1 shows the relations of the content of the resin and the volume resistivity of three different materials. Referring to Table 1, the resin content of the material (A) is about 3~7% by weight or by volume and the volume resistivity is about $2 \times 10^{-5} \sim 5 \times 10^{-5}$ Ω·cm, while the resin content of the material (C) is about 0.1~0.3% by weight or by volume and the volume resistivity is about $4.8 \times 10^{-6}$ Ω·cm. From Table 1, a higher resin content of the adhesive layer 140 may result in increasing the adhesion and reducing the shrinkage during a curing process, and increasing volume resistivity as well.

TABLE 1

| Material | (A) | (B) | (C) |
|---|---|---|---|
| Resin content (%) | 3~7% | 1% | 0.1~0.3% |
| Volume resistivity (Ω · cm) | 2~5 × $10^{-5}$ | 8 × $10^{-6}$ | 4.8 × $10^{-6}$ |

Table 2 (FIG. 5) shows the class of the cross-cut method. As shown in Table 2, the class of 3B is the least specification for the peeling test of shielding layer of the semiconductor package device in accordance with some embodiments of the present disclosure.

Table 3 shows a table of shielding specifications for shielding from electromagnetic interference with low frequency (10 MHz) of a semiconductor package device in accordance with some embodiments of the present disclosure. As shown in Table 3, the material (1) passes the peeling test class of 5B of the cross-cut method, but the shielding effectiveness at 10 MHz is 5.5 dB. Meanwhile, the material (2) has the shielding effectiveness of 32 dB at 10 MHz, but fails the peeling test class of 2B of the cross-cut method.

Referring to Table 3, a shielding layer comprising the material (1) with 10 μm and the material (2) with 35 μm passes the peeling test class of 5B of the cross-cut method and has the shielding effectiveness of 31 dB.

TABLE 3

| Material | VR (Ω · cm) | Coating thickness (μm) | Shielding Effectiveness (dB) at 10 |
|---|---|---|---|
| (1) | 3.5 × $10^{-5}$ | 12 | 5.5 |
| (2) | 4.8 × $10^{-6}$ | 43 | 32 |
| (3) | 5 × $10^{-6}$ | 42 | 31 |
|  |  | 24 | 24 |
|  |  | 12 | 18.5 |
| (1) + (2) |  | 30 (8 + 22) | 21 |
|  |  | 45 (10 + 35) | 31 |

According to some embodiments of the present disclosure, the ratio of the thickness of the base layer 150 to the thickness of the adhesive layer 140 ranges from 1:1 to 5:1. If the ratio decreases, the shielding effectiveness is less effective, compared to the same thickness of the shielding layer; if the ratio increases, the function of the adhesive layer 140 decreases and the risk of the peeling of the shielding layer becomes high.

Figure 5:
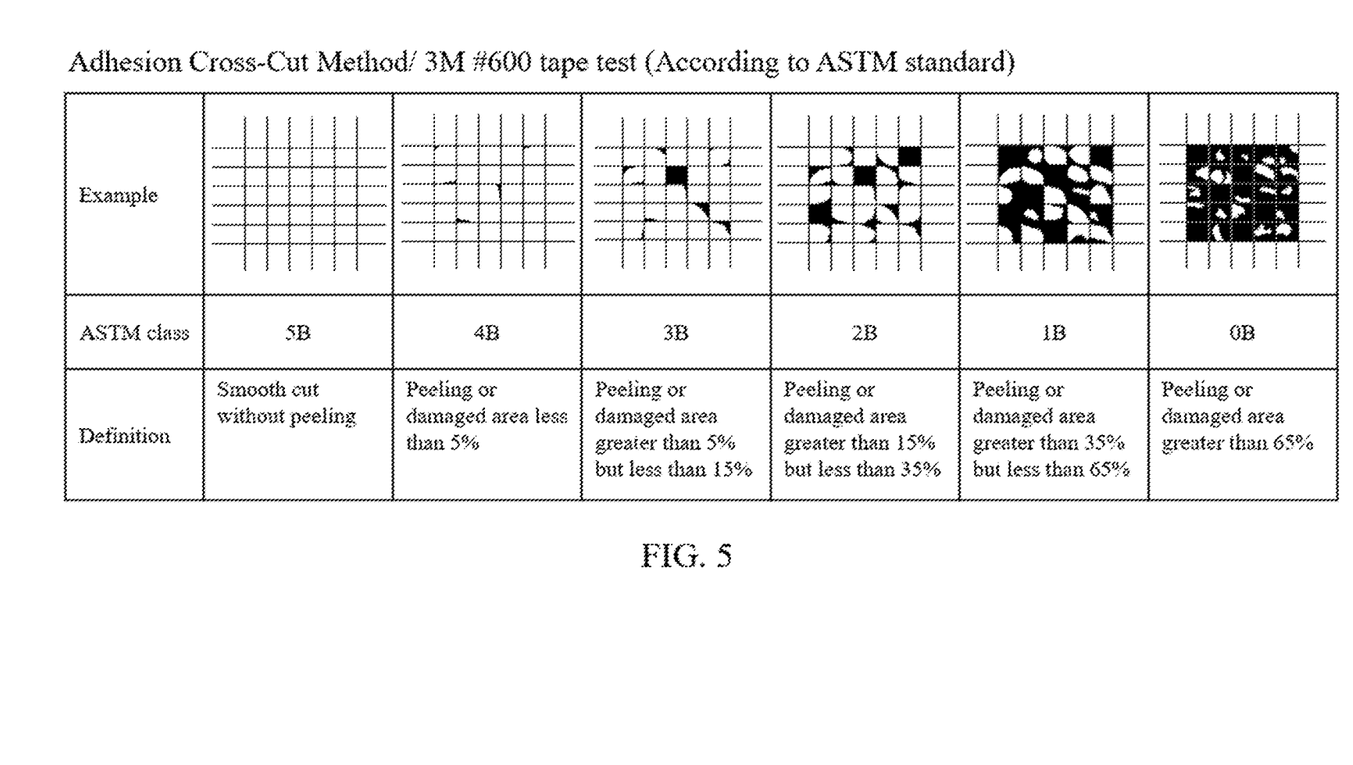
FIG. 5 is a table illustrating a cross-cut method in accordance with some embodiments of the present disclosure.

According to some embodiments of the present disclosure, a thickness of the adhesive layer 140 is less than that of the base layer 150. As shown in FIG. 5, with the same thickness of shielding layers, the shielding layer with lower volume resistivity can achieve better shielding effectiveness. On the other hand, with the same volume resistivity of shielding layers, increasing the thickness of the shielding layer will increase the shielding effectiveness accordingly.

In accordance with some embodiments of the present disclosure, a semiconductor package device comprises a substrate. A shielding layer is disposed on the insulation layer. The shielding layer shields or protects component(s) or device(s) disposed on the substrate from electromagnetic interference with relatively low frequency. The shielding layer may include a layer and a base layer. The layer is disposed between the insulation layer and the base layer.

The layer includes metal. The layer may include insulation filler(s). The layer may include filler(s) which includes a resin or an epoxy. The base layer includes metal. The base layer may include insulation filler(s). The base layer may include filler(s) which includes a resin or an epoxy.

According to some embodiments of the present disclosure, amount or quantity of the epoxy or resin within the layer is greater than that of the base layer. According to some embodiments of the present disclosure, amount or quantity of resin within the layer is about 3~7% by weight. Amount or quantity of the epoxy or resin within the base layer is about 0.1~0.3% by weight. According to some embodiments of the present disclosure, amount or quantity of resin within the layer is about 3~7% by volume. Amount or quantity of the epoxy or resin within the base layer is about 0.1~0.3% by volume.

According to some embodiments of the present disclosure, a size of the filler within the layer is greater than that within the base layer. Meanwhile, a volume resistivity of the layer is greater than that of the base layer. According to some embodiments of the present disclosure, the volume resistivity of the layer is about $2\times10^{-5}\sim5\times10^{-5}$ Ω·cm. According to some embodiments of the present disclosure, the volume resistivity of the second metal layer is about $4.8\times10^{-6}$ Ω·cm.

According to some embodiments of the present disclosure, the shielding layer passes a peeling test class of at least 3B of a cross-cut method, and a shielding effectiveness of the shielding layer is at least or equal to 30 dB.

The present disclosure also provides a method of manufacturing a semiconductor package device. According to some embodiments of the present disclosure, an insulation layer is provided on a substrate. The insulation layer may include a molding compound or encapsulation material.

Next, forming an adhesive layer on the insulation layer by spray coating. The adhesive layer can be a conductive paste, which may include resin. The adhesive layer may include particles or fillers.

Subsequently, forming a base layer on the adhesive layer by spray coating. The base layer may be a conductive paste, which may include resin. The base layer may include particles or fillers. The size of the fillers of the adhesive layer is greater than that of the base layer.

Next, a sintering process may apply to the adhesive layer. A curing process may apply to the adhesive layer.

Also, a sintering process may apply to the base layer. A curing process may apply to the base layer. Thus, the semiconductor package device is formed.

Figure 4:
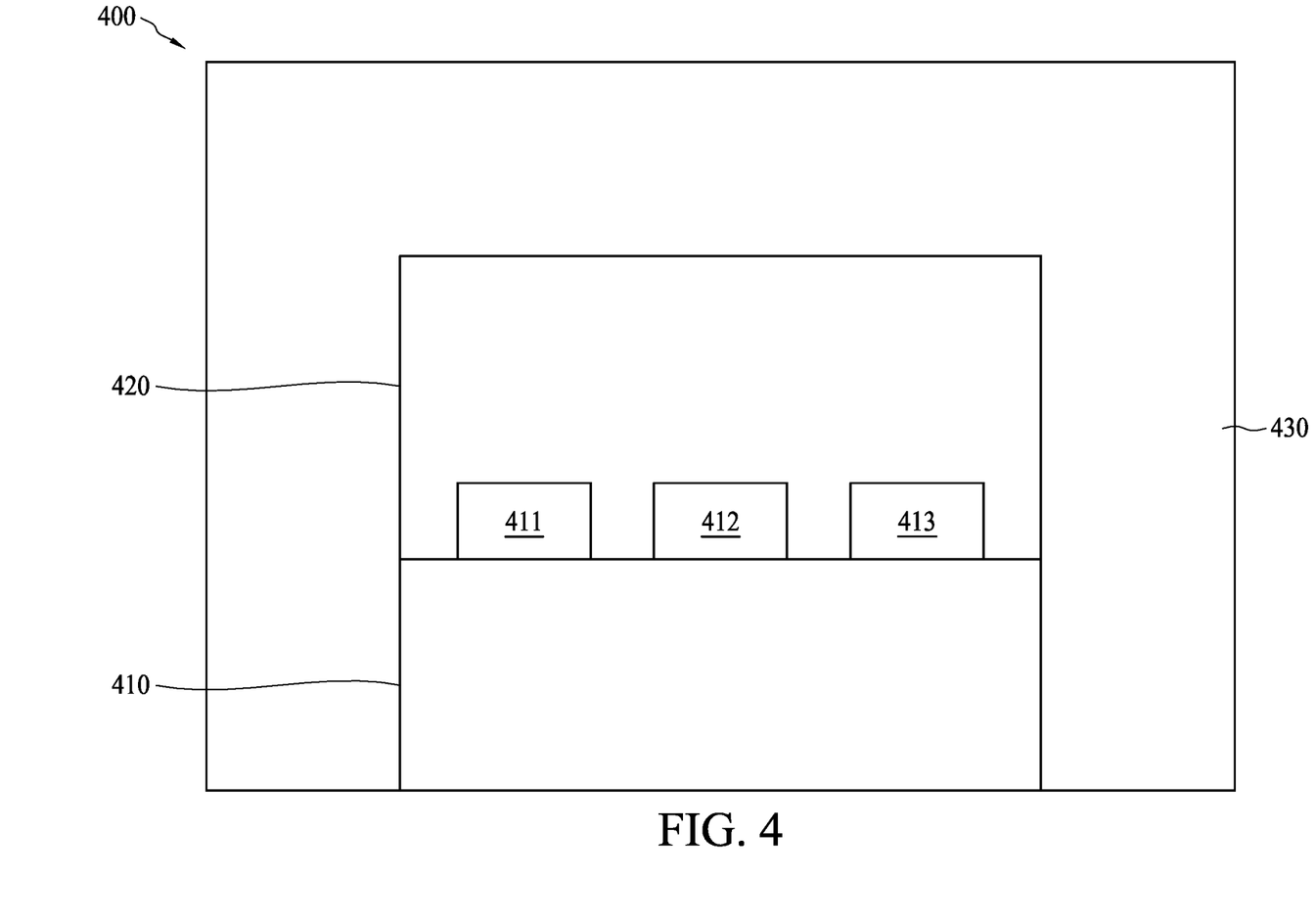
FIG. 4 shows a cross-sectional view of a semiconductor package device in accordance with another aspect of the present disclosure.

FIG. 4 shows a cross-sectional view of a semiconductor package device 400 in accordance with another aspect of the present disclosure. The semiconductor package device 400 comprises a substrate 410. An insulation layer 420 is disposed on the substrate 410. A shielding layer 430 is disposed on the insulation layer 420. The shielding layer 430 shields or protects component(s) or device(s) (e.g., 411, 412, 413, and so forth) disposed on the substrate 410 from electromagnetic interference. The shielding layer 430 is a single layer. As discussed, the thickness of the shielding layer 430 should reach about 40 μm to shield from electromagnetic interference with low frequency. If the thickness of a shielding layer is less than 40 μm, the shielding layer fails to meet the specifications of the shielding effectiveness of 30 dB. On the other hand, if the thickness of the shielding layer 430 is about 40 μm, the adhesion provided by the shielding layer 430 is weak and will cause the peeling of the shielding layer 430 from the molding compound. As a result, the shielding layer may fail to pass the peeling test class of 3B of the cross-cut method.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
a substrate;
an insulation layer disposed on the substrate; and
a shielding layer disposed on the insulation layer, wherein the shielding layer includes a first conductive layer disposed on the insulation layer and a second conductive layer disposed on the first conductive layer, the first conductive layer and the second conductive layer including a filler consisting of at least a resin, wherein the shielding layer passes a peeling test class of at least 3B of a cross-cut method, and a shielding effectiveness of the shielding layer is at least or equal to 30 dB, and wherein a thickness of the first conductive layer is less than that of the second conductive layer.

2. The semiconductor package device of claim 1, wherein a content of the resin within the first conductive layer is greater than that of the second conductive layer.

3. The semiconductor package device of claim 2, wherein the content of the resin within the first conductive layer is about 3~7%.

4. The semiconductor package device of claim 2, wherein the content of the resin within the second conductive layer is about 0.1~0.3%.

5. The semiconductor package device of claim 1, wherein a size of the filler within the first conductive layer is greater than that within the second conductive layer.

6. The semiconductor package device of claim 1, wherein a volume resistivity of the first conductive layer is greater than that of the second conductive layer.

7. The semiconductor package device of claim 6, wherein the volume resistivity of the first conductive layer is about $2\times10^{-5}$~$5\times10^{-5}$ Ω·cm.

8. The semiconductor package device of claim 6, wherein the volume resistivity of the second conductive layer is about $4.8\times10^{-6}$ Ω·cm.

9. The semiconductor package device of claim 1, wherein the filler further consists of at least a metal particle, a size of the metal particle in the first conductive layer being greater than that in the second conductive layer.

10. The semiconductor package device of claim 1, wherein the shielding effectiveness of the shielding layer is at least or equal to 30 dB under a frequency of 10 MHz.

11. The semiconductor package device of claim 1, wherein the shielding layer passes the peeling test class of 5B of the cross-cut method.

12. A semiconductor package device, comprising:
a substrate;
an insulation layer disposed on the substrate; and
a first conductive layer disposed on the insulation layer, wherein the first conductive layer includes a first filler; and
a second conductive layer disposed on the first conductive layer, wherein the second conductive layer includes a second filler,
wherein a size of the first filler is greater than that of the second filler.

13. The semiconductor package device of claim 12, wherein the first filler includes at least a first resin, and the second filler includes at least a second resin.

14. The semiconductor package device of claim 13, wherein a content of the first resin within the first conductive layer is greater than that within the second resin of the second conductive layer.

15. The semiconductor package device of claim 12, wherein a volume resistivity of the first conductive layer is greater than that of the second conductive layer.

16. The semiconductor package device of claim 12, wherein the filler further consists of at least a metal particle, a size of the metal particle in the first conductive layer being greater than that in the second conductive layer.

17. The semiconductor package device of claim 14, wherein the content of the first resin within the first conductive layer is about 3~7%, and wherein the content of the second resin within the second conductive layer is about 0.1~0.3%.

18. The semiconductor package device of claim 15, wherein a volume resistivity of the first conductive layer is about $2\times10^{-5}$~$5\times10^{-5}$ Ω·cm, and wherein a volume resistivity of the second conductive layer is about $4.8\times10^{-6}$ Ω·cm.

19. The semiconductor package device of claim 12, wherein a thickness of the first conductive layer is less than a thickness of the second conductive layer.

* * * * *